United States Patent
Chen

(10) Patent No.: US 12,332,279 B2
(45) Date of Patent: Jun. 17, 2025

(54) PREHEATING CONTROL SYSTEM, PREHEATING CONTROL METHOD AND NON-TRANSIENT COMPUTER READABLE STORAGE MEDIUM

(71) Applicant: NANYA TECHNOLOGY CORPORATION, New Taipei (TW)

(72) Inventor: Tien Yu Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 265 days.

(21) Appl. No.: 18/299,711

(22) Filed: Apr. 12, 2023

(65) Prior Publication Data

US 2024/0345135 A1   Oct. 17, 2024

(51) Int. Cl.
| | |
|---|---|
| *G01R 31/44* | (2020.01) |
| *G01R 1/44* | (2006.01) |
| *G01R 31/28* | (2006.01) |
| *H01L 21/66* | (2006.01) |
| *H01L 21/67* | (2006.01) |

(52) U.S. Cl.
CPC ........... *G01R 1/44* (2013.01); *G01R 31/2831* (2013.01); *H01L 21/67103* (2013.01); *H01L 22/14* (2013.01)

(58) Field of Classification Search
CPC .......... G01R 1/00; G01R 31/00; G01R 31/28; G01R 31/282; H01L 21/00; H01L 21/67; H01L 21/67005; H01L 21/67011; H01L 21/67098; H01L 22/00; H01L 22/10

USPC ........................ 324/500, 537, 750.01, 750.03
See application file for complete search history.

(56) References Cited

U.S. PATENT DOCUMENTS

| | | | |
|---|---|---|---|
| 2010/0248165 A1* | 9/2010 | Itai | G03B 27/32 |
| | | | 702/182 |
| 2020/0378832 A1* | 12/2020 | Wilson | H01L 21/67248 |

FOREIGN PATENT DOCUMENTS

TW   1698934 B  * 7/2020 ........... H01L 21/324

\* cited by examiner

*Primary Examiner* — Hoai-An D. Nguyen
(74) *Attorney, Agent, or Firm* — CKC & Partners Co., LLC

(57) ABSTRACT

A preheating control system comprising a testing device and a processor is provided in present disclosure. The testing device is configured to perform a wafer testing on a wafer lot and perform a device preheating on the testing device. The processor is coupled to the testing device and comprises a timing circuit and a controlling circuit. The timing circuit is configured to calculate a lot-changing time, wherein the lot-changing time is a difference between a time corresponding to removal of a previous wafer lot from the testing device and a time corresponding to insertion of the wafer lot into the testing device. The controlling circuit is configured to control the testing device to perform the wafer testing, and configured to control the testing device to perform the device preheating according to the lot-changing time and a standard lot-changing time.

20 Claims, 2 Drawing Sheets

PREHEATING CONTROL SYSTEM, PREHEATING CONTROL METHOD AND NON-TRANSIENT COMPUTER READABLE STORAGE MEDIUM

BACKGROUND

Technical Field

The present disclosure relates to preheating control of wafer testing device. More particularly, the present disclosure relates to a preheating control system, a preheating control method and a non-transient computer readable storage medium.

Description of Related Art

At present, a wafer testing device is generally used to measure electrical properties and yield of wafer lots. However, if the wafer testing device is idle for a long time, the device temperature of the wafer testing device will be unstable, resulting in inaccurate measuring results. Therefore, the wafer testing device usually comprises a preheating system for keeping the device temperature of the wafer testing device in a preset temperature.

However, because the wafer testing device performs device preheating whenever a wafer lot is inserted into the wafer testing device, the total measuring time of each wafer lot may increase, resulting in the loss of the productivity. Therefore, how to effectively control the preheating system is one of the topics in this field.

SUMMARY

The present disclosure provides a preheating control system comprising a testing device and a processor. The testing device is configured to perform a wafer testing on a wafer lot and perform a device preheating on the testing device. The processor is coupled to the testing device and comprises a timing circuit and a controlling circuit. The timing circuit is configured to calculate a lot-changing time, wherein the lot-changing time is a difference between a time corresponding to removal of a previous wafer lot from the testing device and a time corresponding to insertion of the wafer lot into the testing device. The controlling circuit is configured to control the testing device to perform the wafer testing, and configured to control the testing device to perform the device preheating according to the lot-changing time and a standard lot-changing time.

The present disclosure provides a preheating control method, suitable for a preheating control system comprising a testing device and a processor, comprising: (a) calculating, by a timing circuit of the processor, a lot-changing time, wherein the lot-changing time is a difference between a time corresponding to removal of a previous wafer lot from the testing device and a time corresponding to insertion of a wafer lot into the testing device; (b) comparing, by the processor, the lot-changing time with a standard lot-changing time, so as to determine whether to control the testing device to perform a device preheating on the testing device by a controlling circuit of the processor; and (c) controlling, by the controlling circuit, the testing device to perform a wafer testing on the wafer lot.

The present disclosure provides a non-transient computer readable storage medium storing a plurality of computer readable instructions, when the plurality of computer readable instructions are executed for controlling a preheating control system comprising a testing device, by one or a plurality of processors, the one or the plurality of processors is configured to perform the following operations: (a) calculating a lot-changing time, wherein the lot-changing time is a difference between a time corresponding to removal of a previous wafer lot from the testing device and a time corresponding to insertion of a wafer lot into the testing device; (b) comparing the lot-changing time with a standard lot-changing time, so as to determine whether to control the testing device to perform a device preheating on the testing device; and (c) controlling the testing device to perform a wafer testing on the wafer lot.

With the preheating control system, the preheating control method and the non-transient computer readable storage medium in present disclosure, the testing device is able to perform the device preheating only when the switching time of different wafer lots is greater than a preset time length, instead of performing the device preheating whenever wafer lot changes, so as to decrease the time of wafer testing and therefore increase the productivity of wafers.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
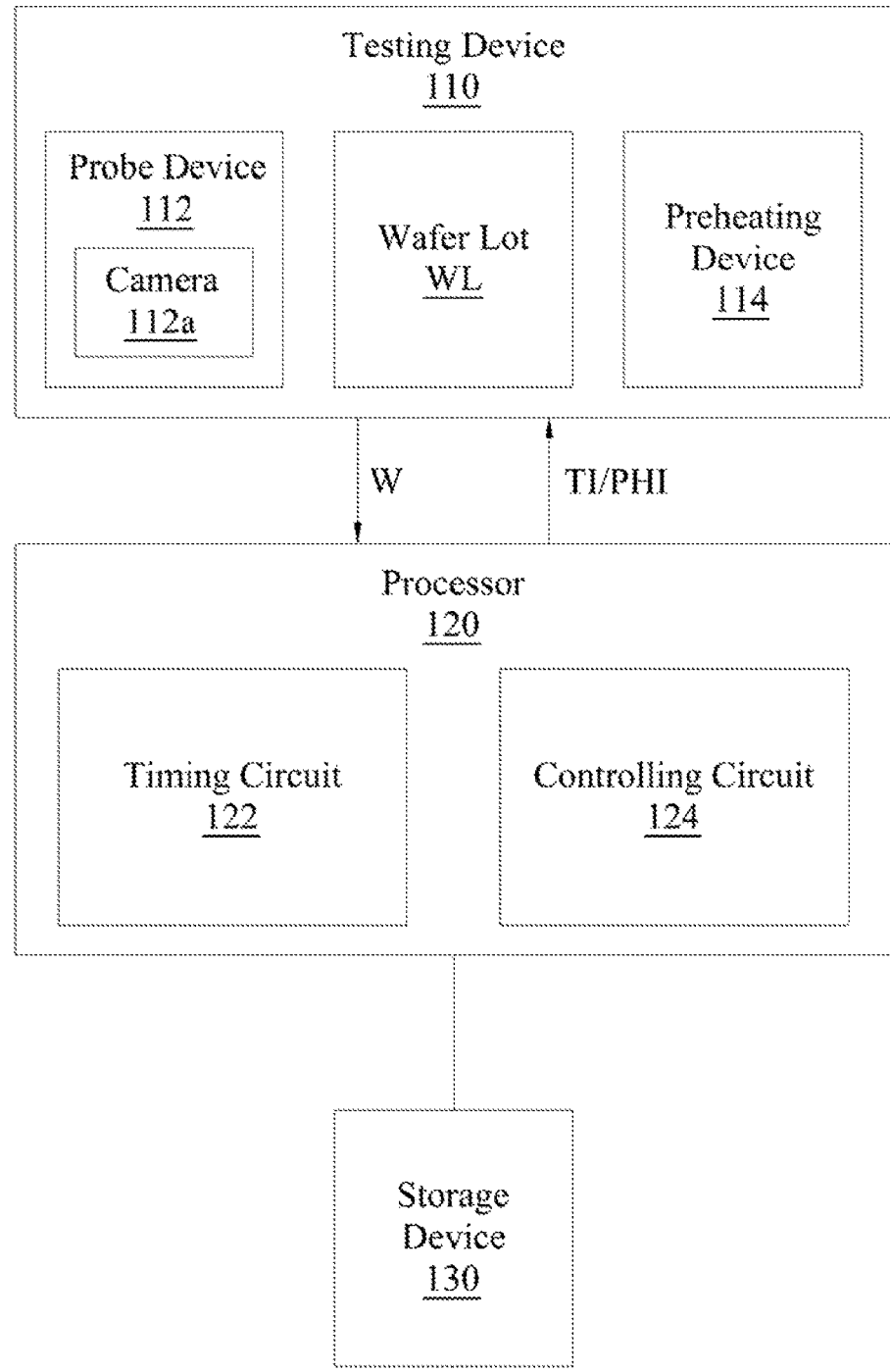
FIG. 1 is a schematic diagram of a preheating control system in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic diagram of a preheating control system 100 in accordance with some embodiments of the present disclosure. In some embodiments, the preheating control system 100 comprises a testing device 110, a processor 120 and a storage device 130. The testing device 110 is coupled to the processor 120 and comprises a probe device 112 and a preheating device 114.

The probe device 112 is configured to perform a wafer testing on a wafer lot WL. Operationally, when the testing device 110 receives a testing instruction TI from the processor 120, the probe device 112 measures characteristics (e.g., electrical properties or yield) of the wafer lot WL.

In some embodiments, the probe device 112 comprises a camera 112a. The camera 112a is configured to capture a plurality of wafer images W of a space for accommodating the wafer lot. The wafer images W are transmitted to the processor 120 for confirming whether the wafer lot WL is properly inserted into/removed from the testing device 110.

The preheating device 114 is configured to perform a device preheating on the testing device 110. Operationally, in response to the testing device 110 receiving a preheating instruction PHI from the processor 120, the preheating device 114 preheats the testing device 110 for a preheating time period, so as to keep the device temperature of the testing device 110 in a preset temperature. In some embodiments, the preheating time period is about 15 minutes.

The processor 120 is coupled to the testing device 110 and the storage device 130, and configured to control the testing device 110 to perform the wafer testing and the device preheating. In some embodiments, the processor 120 is coupled to the testing device 110 by a general purpose interface bus (GPIB).

In some embodiments, the processor 120 may be implemented with a central processing unit (CPU), a multi-processor, a distributed processing system, an application specific integrated circuit (ASIC), other devices with processing function or any combination of the above devices.

In some embodiments, the processor 120 comprises a timing circuit 122 and a controlling circuit 124. The timing circuit 122 is configured to calculate a lot-changing time, wherein the lot-changing time is the difference between a time corresponding to removal of a previous wafer lot from the testing device 110 and a time corresponding to insertion of the wafer lot WL into the testing device 110.

The controlling circuit 124 is configured to transmit the testing instruction TI to the testing device 110 for performing the wafer testing, and configured to transmit the preheating instruction PHI to the testing device 110 for the device preheating, according to the lot-changing time and a standard lot-changing time. In some embodiments, the standard lot-changing time is between 15 minutes and 30 minutes. The way that the controlling circuit 124 controls the testing device 110 will be described in detail in following paragraphs.

The storage device 130 is coupled to the processor 120. In some embodiments, the storage device 130 is configured to store the preheating time period and the standard lot-changing time. In some embodiments, the storage device 130 may be implemented with a random access memory (RAM), a read-only memory (ROM), a flash memory, a hard disk, other devices with storage function or any combination of the above devices.

Figure 2:
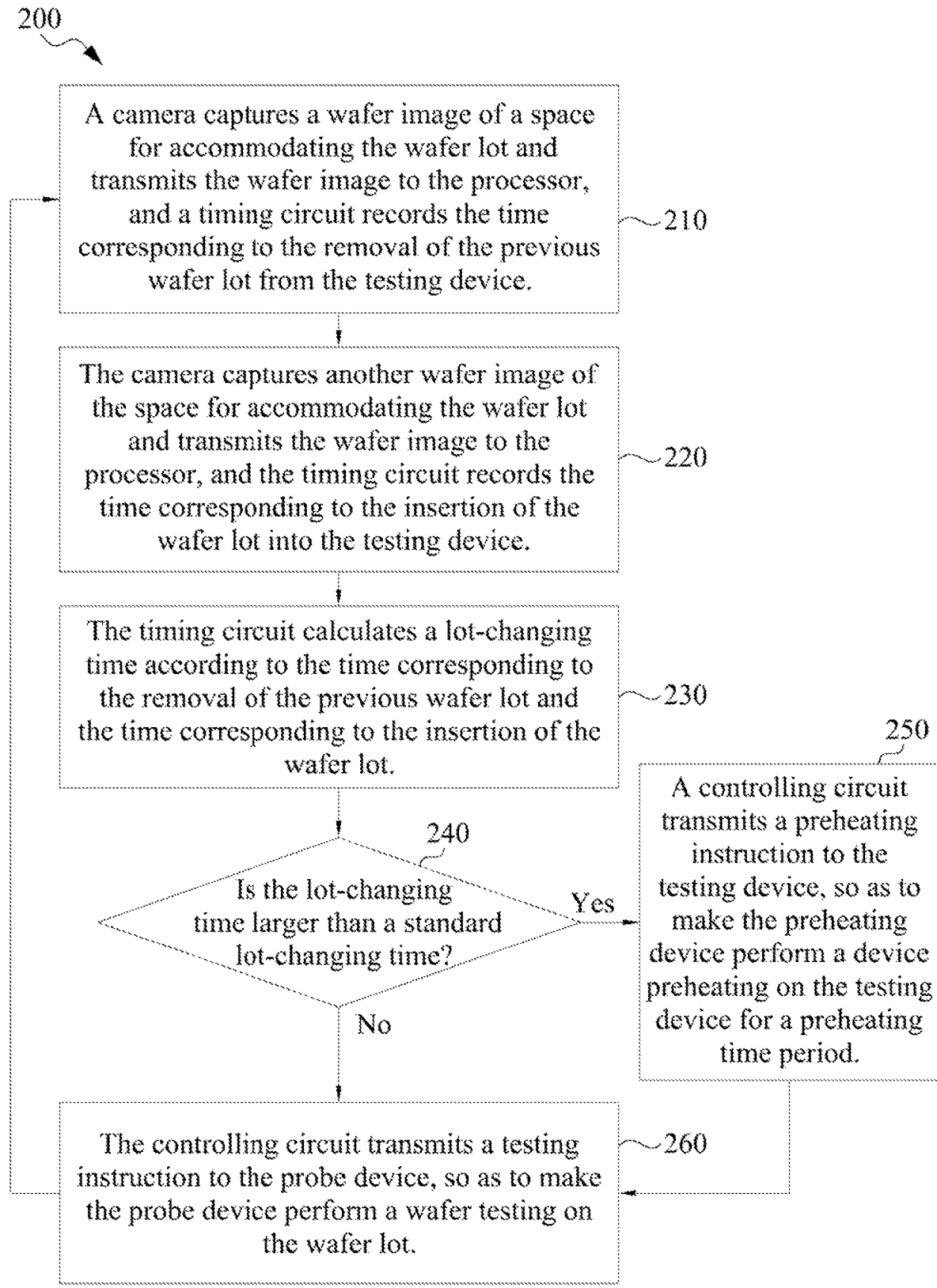
FIG. 2 is a flowchart of a preheating control method in accordance with some embodiments of the present disclosure.

FIG. 2 is a flowchart of a preheating control method 200 in accordance with some embodiments of the present disclosure. In some embodiments, the preheating control method 200 comprises steps 210-260.

In step 210, the camera 112a captures an image W of a space for accommodating the wafer lot and transmits the wafer images W to the processor 120, so as to determine whether the previous wafer lot is properly removed from the testing device 110. When the processor 120 determines that the previous wafer lot is properly removed from the testing device 110 based on the wafer image W, the timing circuit 122 records the time corresponding to the removal of the previous wafer lot from the testing device 110 (e.g., the time that the wafer image W showing that the previous wafer lot is properly removed is captured).

In step 220, the camera 112a captures another wafer image W of the space for accommodating the wafer lot and transmits the wafer image W to the processor 120, so as to determine whether the wafer lot WL is properly inserted into the testing device 110. When the processor 120 determines that the wafer lot WL is properly inserted into the testing device 110 based on the wafer image W, the timing circuit 122 records the time corresponding to the insertion of the wafer lot WL into the testing device 110 (e.g., the time that the wafer image W showing that the wafer lot WL is properly inserted is captured).

In step 230, the timing circuit 122 calculates the lot-changing time, wherein the lot-changing time is the difference between the time corresponding to the removal of the previous wafer lot from the testing device 110 (i.e., the time obtained in step 210) and the time corresponding to the insertion of the wafer lot WL into the testing device 110 (i.e., the time obtained in step 220).

In step 240, the processor 120 compares the lot-changing time with the standard lot-changing time. When the lot-changing time is greater than the standard lot-changing time, step 250 and step 260 will be performed in sequence. On the other hand, when the lot-changing time is less than or equal to the standard lot-changing time, step 250 will be omitted, and step 260 will be directly performed.

In step 250, the controlling circuit 124 transmits the preheating instruction PHI to the testing device 110, so as to make the preheating device 114 perform the device preheating on the testing device 110 for the preheating time period and keep the device temperature of the testing device 110 in a preset temperature.

In step 260, the controlling circuit 124 transmits the testing instruction TI to the probe device 112, so as to make the probe device 112 perform the wafer testing on the wafer lot WL and obtain the characteristics (e.g., electrical properties or yield) of the wafer lot WL.

In an embodiment that the standard lot-changing time is 15 minutes, if the previous wafer lot is removed from the testing device 110 at 10:00 A.M. and the wafer lot WL is inserted into the testing device 110 at 10:20 A.M., step 250 will be performed earlier than step 260 because of the 20 minutes lot-changing time greater than the standard lot-changing time.

In another embodiment that the standard lot-changing time is 15 minutes, if the previous wafer lot is removed from the testing device 110 at 10:00 A.M. and the wafer lot WL is inserted into the testing device 110 at 10:10 A.M, step 250 will be omitted and step 260 will be directly performed because of the 10 minutes lot-changing time less than the standard lot-changing time.

Next, after the measurements of the wafer lot WL (i.e., step 260 is completed), step 210 will be performed again. That is, the wafer lot WL will be removed from the testing device 110, and the next wafer lot will be inserted into the testing device 110 for wafer testing.

It will be understood that the preheating control method 200 discussed herein may comprise greater or fewer operations than illustrated in FIG. 2, and the steps 210-260 may be performed in any order, as appropriate.

The present disclosure provides a non-transient computer readable storage medium storing a plurality of computer readable instructions, when the plurality of computer readable instructions are executed by one or a plurality of processors, the one or the plurality of processors is configured to perform the steps 210-260 of the preheating control method 200 described above.

With the preheating control system 100, the preheating control method 200 and the non-transient computer readable storage medium in present disclosure, the testing device 110 is able to perform the device preheating only when the lot-changing time is greater than the standard lot-changing time, instead of performing device preheating whenever wafer lot changes, so as to decrease the time of wafer testing and therefore increase the productivity of wafers.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A preheating control system, comprising:
   a testing device, configured to perform a wafer testing on a wafer lot and perform a device preheating on the testing device; and
   a processor, coupled to the testing device, comprising:
      a timing circuit, configured to calculate a lot-changing time, wherein the lot-changing time is a difference between a time corresponding to removal of a previous wafer lot from the testing device and a time corresponding to insertion of the wafer lot into the testing device; and
      a controlling circuit, configured to control the testing device to perform the wafer testing, and configured to control the testing device to perform the device preheating according to the lot-changing time and a standard lot-changing time.

2. The preheating control system of claim 1, wherein the testing device comprises a camera configured to capture a plurality of wafer images of a space for accommodating the wafer lot and the previous wafer lot.

3. The preheating control system of claim 2, wherein the processor is further configured to receive a first wafer image of the plurality of wafer images, wherein the first wafer image indicates that the previous wafer lot has been removed from the testing device, and the processor determines, according to the first wafer image, the time corresponding to the removal of the previous wafer lot from the testing device, and
   the processor is further configured to receive a second wafer image of the plurality of wafer images, wherein the second wafer image indicates that the wafer lot has been inserted into the testing device, and the processor determines the time corresponding to the insertion of the wafer lot into the testing device.

4. The preheating control system of claim 1, wherein when the lot-changing time is less than or equal to the standard lot-changing time, after the insertion of the wafer lot into the testing device, the controlling circuit controls the testing device to omit the device preheating and perform the wafer testing.

5. The preheating control system of claim 4, wherein when the lot-changing time is greater than the standard lot-changing time, after the insertion of the wafer lot into the testing device, the controlling circuit controls the testing device to perform the device preheating and the wafer testing.

6. The preheating control system of claim 5, wherein the device preheating is performed earlier than the wafer testing.

7. The preheating control system of claim 1, wherein the standard lot-changing time is between 15 minutes and 30 minutes.

8. The preheating control system of claim 1, further comprising a storage device configured to store the standard lot-changing time.

9. A preheating control method, suitable for a preheating control system comprising a testing device and a processor, comprising:
   (a) calculating, by a timing circuit of the processor, a lot-changing time, wherein the lot-changing time is a difference between a time corresponding to removal of a previous wafer lot from the testing device and a time corresponding to insertion of a wafer lot into the testing device;
   (b) comparing, by the processor, the lot-changing time with a standard lot-changing time, so as to determine whether to control the testing device to perform a device preheating on the testing device by a controlling circuit of the processor; and
   (c) controlling, by the controlling circuit, the testing device to perform a wafer testing on the wafer lot.

10. The preheating control method of claim 9, wherein step (a) comprises:
    capturing, by a camera of the testing device, a plurality of wafer images of a space for accommodating the wafer lot and the previous wafer lot;
    receiving, by the processor, a first wafer image of the plurality of wafer images, wherein the first wafer image indicates that the previous wafer lot has been removed from the testing device;
    determining, by the processor, according to the first wafer image, the time corresponding to the removal of the previous wafer lot from the testing device;
    receiving, by the processor, a second wafer image of the plurality of wafer images, wherein the second wafer image indicates that the wafer lot has been inserted into the testing device;
    determining, by the processor, according to the second wafer image, the time corresponding to the insertion of the wafer lot into the testing device; and
    calculating, by the timing circuit, the lot-changing time according to the time corresponding to the removal of the previous wafer lot from the testing device and the time corresponding to the insertion of the wafer lot into the testing device.

11. The preheating control method of claim 9, wherein step (b) comprises:
    in response to the lot-changing time being less than or equal to the standard lot-changing time, after the insertion of the wafer lot into the testing device, the controlling circuit controls the testing device to omit the device preheating and perform the wafer testing.

12. The preheating control method of claim 11, wherein step (b) further comprises:

in response to the lot-changing time being greater than the standard lot-changing time, after the insertion of the wafer lot into the testing device, the controlling circuit controls the testing device to perform the device preheating and the wafer testing.

13. The preheating control method of claim 9, wherein step (b) is performed earlier than step (c).

14. The preheating control method of claim 9, wherein the standard lot-changing time is between 15 minutes and 30 minutes.

15. A non-transient computer readable storage medium, storing a plurality of computer readable instructions, when the plurality of computer readable instructions are executed for controlling a preheating control system comprising a testing device, by one or a plurality of processors, the one or the plurality of processors is configured to perform the following operations:

(a) calculating a lot-changing time, wherein the lot-changing time is a difference between a time corresponding to removal of a previous wafer lot from the testing device and a time corresponding to insertion of a wafer lot into the testing device;

(b) comparing the lot-changing time with a standard lot-changing time, so as to determine whether to control the testing device to perform a device preheating on the testing device; and (c) controlling the testing device to perform a wafer testing on the wafer lot.

16. The non-transient computer readable storage medium of claim 15, wherein operation (a) comprises:

controlling a camera of the testing device to capture a plurality of wafer images of a space for accommodating the wafer lot and the previous wafer lot;

receiving a first wafer image of the plurality of wafer images, wherein the first wafer image indicates that the previous wafer lot has been removed from the testing device;

determining the time corresponding to the removal of the previous wafer lot from the testing device according to the first wafer image;

receiving a second wafer image of the plurality of wafer images, wherein the second wafer image indicates that the wafer lot has been inserted into the testing device;

determining the time corresponding to the insertion of the wafer lot into the testing device according to the second wafer image; and calculating the lot-changing time according to the time corresponding to the removal of the previous wafer lot from the testing device and the time corresponding to the insertion of the wafer lot into the testing device.

17. The non-transient computer readable storage medium of claim 15, wherein operation (b) comprises:

in response to the lot-changing time being less than or equal to the standard lot-changing time, after the insertion of the wafer lot into the testing device, controlling the testing device to omit the device preheating and perform the wafer testing.

18. The non-transient computer readable storage medium of claim 17, wherein operation (b) further comprises:

in response to the lot-changing time being greater than the standard lot-changing time, after the insertion of the wafer lot into the testing device, controlling the testing device to perform the device preheating and the wafer testing.

19. The non-transient computer readable storage medium of claim 15, wherein operation (b) is performed earlier than operation (c).

20. The non-transient computer readable storage medium of claim 15, wherein the standard lot-changing time is between 15 minutes and 30 minutes.

* * * * *